US010388684B2

(12) United States Patent
Kinsman et al.

(10) Patent No.: US 10,388,684 B2
(45) Date of Patent: Aug. 20, 2019

(54) IMAGE SENSOR PACKAGES FORMED USING TEMPORARY PROTECTION LAYERS AND RELATED METHODS

(71) Applicant: SEMICONDUCTOR COMPONENTS INDUSTRIES, LLC, Phoenix, AZ (US)

(72) Inventors: Larry Duane Kinsman, Boise, ID (US); Swarnal Borthakur, Boise, ID (US); Marc Allen Sulfridge, Boise, ID (US); Scott Donald Churchwell, Meridian, ID (US); Brian Vaartstra, Nampa, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/285,197

(22) Filed: Oct. 4, 2016

(65) Prior Publication Data

US 2018/0097028 A1    Apr. 5, 2018

(51) Int. Cl.
*H01L 31/00* (2006.01)
*H01L 27/146* (2006.01)

(52) U.S. Cl.
CPC .... *H01L 27/14621* (2013.01); *H01L 27/1462* (2013.01); *H01L 27/14618* (2013.01); *H01L 27/14623* (2013.01); *H01L 27/14627* (2013.01); *H01L 27/14632* (2013.01); *H01L 27/14685* (2013.01); *H01L 27/14687* (2013.01)

(58) Field of Classification Search
None
See application file for complete search history.

(56) References Cited

U.S. PATENT DOCUMENTS

| 8,125,042 B2* | 2/2012 | Kim | H01L 27/14618 257/100 |
| 2006/0071152 A1* | 4/2006 | Ono | H01L 21/6835 250/214.1 |
| 2007/0152251 A1* | 7/2007 | Park | H01L 27/14627 257/294 |

(Continued)

OTHER PUBLICATIONS

"KAI-2020 1600 (H) x 1200 (V) Interline CCD Image Sensor," published by Semiconductor Components Industries, LC of Phoenix, AZ, Dec. 2015, last accessed Sep. 14, 2016 at http://www.onsemi.com/pub_link/Collateral/KAI-2020-D.PDF.

*Primary Examiner* — Kevin M Picardat
(74) *Attorney, Agent, or Firm* — IPTechLaw

(57) ABSTRACT

An image sensor package may include a semiconductor wafer having a pixel array, a color filter array (CFA) formed over the pixel array, and one or more lenses formed over the CFA. A light block layer may couple over the semiconductor wafer around a perimeter of the lenses and an encapsulation layer may be coupled around the perimeter of the lenses and over the light block layer. The light block layer may form an opening providing access to the lenses. A mold compound layer may be coupled over the encapsulation layer and the light block layer. A temporary protection layer may be used to protect the one or more lenses from contamination during application of the mold compound and/or during processes occurring outside of a cleanroom environment.

19 Claims, 7 Drawing Sheets

(56) References Cited

U.S. PATENT DOCUMENTS

| | | | |
|---|---|---|---|
| 2007/0200944 A1* | 8/2007 | Takeuchi | H01L 27/14618 |
| | | | 348/294 |
| 2008/0001068 A1 | 1/2008 | Farnworth et al. | |
| 2010/0301355 A1* | 12/2010 | Wegleiter | H01L 25/0753 |
| | | | 257/88 |
| 2011/0024861 A1 | 2/2011 | Tu et al. | |
| 2011/0049557 A1* | 3/2011 | Meng | H01L 27/14618 |
| | | | 257/99 |
| 2012/0112329 A1* | 5/2012 | Yen | H01L 23/3171 |
| | | | 257/666 |
| 2013/0069176 A1 | 3/2013 | Daamen et al. | |
| 2017/0256577 A1* | 9/2017 | Inoue | H01L 27/14618 |

\* cited by examiner

IMAGE SENSOR PACKAGES FORMED USING TEMPORARY PROTECTION LAYERS AND RELATED METHODS

BACKGROUND

1. Technical Field

Aspects of this document relate generally to image sensor packages. More specific implementations involve molded and/or stacked image sensor packages.

2. Background

Image sensors convey information related to an image by communicating signals in response to incident electromagnetic radiation. Image sensors are used in a variety of devices including smart phones, digital cameras, night vision devices, medical imagers, and many others. Conventional semiconductor imagers utilizing charge-coupled device (CCD) and CMOS architectures are currently in use. Image sensors are sometimes packaged in semiconductor packages that involve molding processes.

SUMMARY

Implementations of image sensor packages (packages) may include: a semiconductor wafer including a pixel array; a color filter array (CFA) formed over the pixel array; one or more lenses formed over the CFA; and a light block layer coupled over the semiconductor wafer around a perimeter of the one or more lenses. The package may include an encapsulation layer coupled around the perimeter of the one or more lenses and over the light block layer, the light block layer forming an opening providing access to the one or more lenses, and a mold compound layer coupled over the encapsulation layer and over the light block layer. A height of the encapsulation layer perpendicular to a largest planar surface of the semiconductor wafer may be configured to prevent a temporary protection layer, applied over the one or more lenses before applying the mold compound layer, from depositing over the encapsulation layer.

Implementations of image sensor packages may include one, all, or any of the following:

The encapsulation layer may be situated/located between the mold compound layer and the one or more lenses.

A transparent cover may be coupled over the one or more lenses and may at least partially define a cavity between the transparent cover and the one or more lenses.

The height of the encapsulation layer perpendicular to the largest planar surface of the semiconductor wafer may be at least 10 microns.

The mold compound layer may contact the encapsulation layer.

An antireflective coating (ARC) layer may be coupled over the encapsulation layer and over the one or more lenses.

The mold compound layer may contact the ARC layer.

The light block layer may have a height perpendicular to the largest planar surface of the semiconductor wafer of at least 3 microns.

Implementations of image sensor packages (packages) may include: a semiconductor wafer having a pixel array; a color filter array (CFA) formed over the pixel array; one or more lenses formed over the CFA; and a light block layer coupled over the semiconductor wafer around a perimeter of the one or more lenses. The package may also include an encapsulation layer coupled around the perimeter of the one or more lenses and over the light block layer; a dam structure coupled at an edge of the encapsulation layer, and; a mold compound layer coupled over the encapsulation layer, coupled over the light block layer, and coupled against the dam structure. A height of the dam structure perpendicular to a largest planar surface of the semiconductor wafer may be configured to prevent a temporary protection layer, applied over the one or more lenses before applying the mold compound layer, from depositing over the encapsulation layer.

Implementations of image sensor packages may include one, all, or any of the following:

Phobicity of the dam structure relative to the temporary protection layer may prevent the temporary protection layer from crossing a face of the dam structure that faces the one or more lenses.

The height of the dam structure perpendicular to the largest planar surface of the semiconductor wafer may be greater than a height of the encapsulation layer perpendicular to the largest planar surface of the semiconductor wafer.

The mold compound layer may contact the encapsulation layer.

Implementations of methods of forming an image sensor package (package) may include: forming a color filter array (CFA) over a pixel array of a semiconductor wafer; forming one or more lenses over the CFA; forming a light block layer around a perimeter of the one or more lenses and over the semiconductor wafer; and forming an encapsulation layer over the light block layer. The method may also include dispensing a liquid over the one or more lenses to form a temporary protection layer for the one or more lenses; forming a mold compound layer over the encapsulation layer while the temporary protection layer is present over the one or more lenses, and; removing the temporary protection layer after forming the mold compound layer. The temporary protection layer may be prevented from depositing over the encapsulation layer by a height of the encapsulation layer perpendicular to a largest planar surface of the semiconductor wafer and a height of a dam structure perpendicular to the largest planar surface of the semiconductor wafer.

Implementations of methods of forming an image sensor package (package) may include one, all, or any of the following:

Dispensing the liquid may include contacting the encapsulation layer with the liquid.

The method may include forming an antireflective coating (ARC) layer over the encapsulation layer and over the one or more lenses, where the mold compound layer contacts the ARC layer, and where dispensing the liquid includes contacting the ARC layer with the liquid.

Dispensing the liquid may include contacting the light block layer with the liquid.

The method may include forming a dam structure at an edge of the encapsulation layer, where dispensing the liquid includes contacting the dam structure with the liquid.

The dam structure may be phobic to the liquid.

The mold compound layer may contact the dam structure.

The mold compound layer may contact the encapsulation layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensor packages formed using temporary protection layers and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor packages formed using temporary protection layers and related methods, and implementing components and methods, consistent with the intended operation and methods.

Image sensor packages and assemblies described herein may include elements/methods of image sensor packages/assemblies described in U.S. patent application Ser. No. 15/171,966, filed Jun. 2, 2016, titled "Image Sensor Chip Scale Packages and Related Methods," listing as first inventor Swarnal Borthakur (hereinafter referred to as "the '966 application"), the disclosure of which is entirely incorporated herein by reference.

Figure 1:
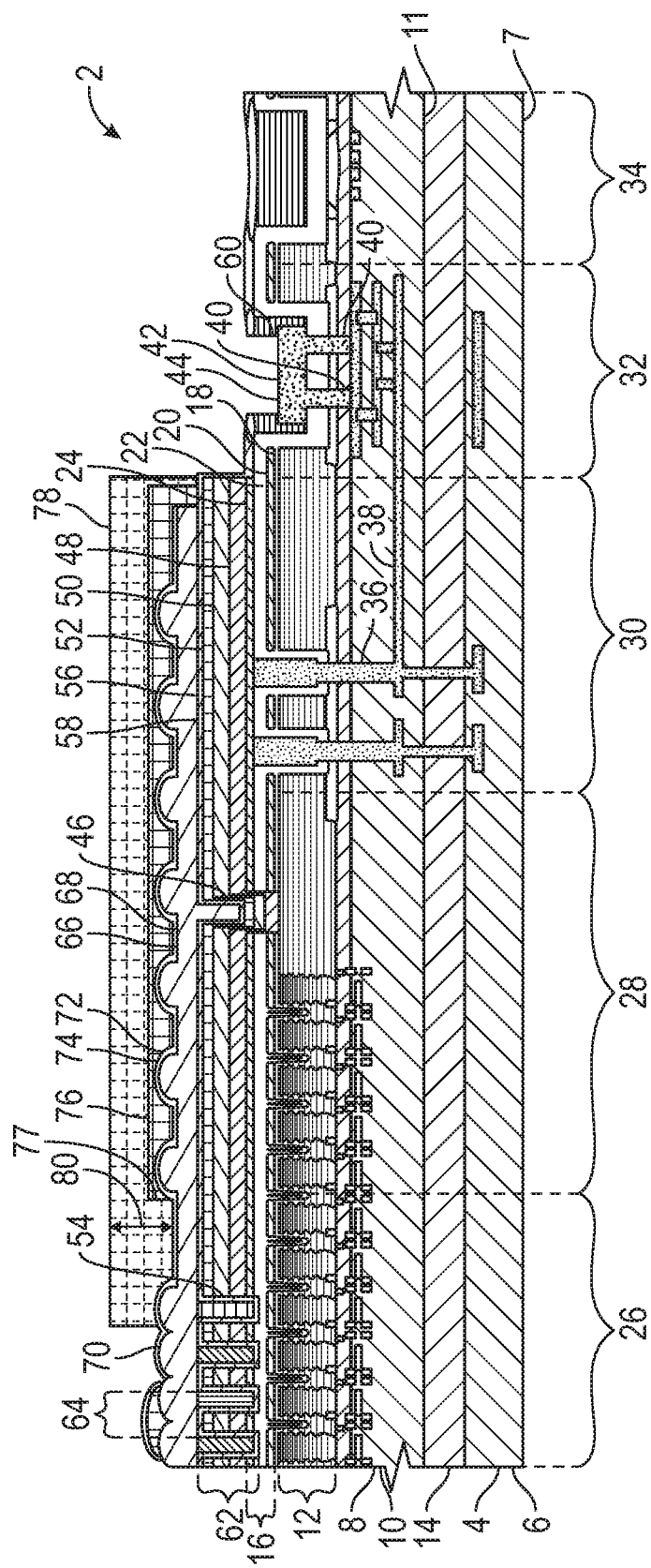
FIG. 1 is a side cross-section view of an implementation of an assembly formed during the formation of an image sensor package.

Referring now to FIG. 1, a conventional assembly 2 used in the formation of an image sensor package (ISP) (package) is shown. The assembly 2 includes a first semiconductor wafer (wafer) 4 and a second semiconductor wafer (wafer) 8 which are stacked and coupled together using a passivation oxide 14. In the implementation shown wafer 4 is an application-specific integrated circuit (ASIC) wafer 6 and wafer 8 is a sensor wafer 10. The ASIC wafer has a largest planar surface 7. In FIG. 1 the bottom surface is pointed out as the largest planar surface but the top surface (adjacent to the passivation oxide) may also be a largest planar surface (and in fact these two surfaces could be equivalent in size in various implementations). Accordingly, "largest planar surface" as used herein conveys the meaning that there are no larger flat surfaces, but not that there are no other flat surfaces of the same size. The sensor wafer has a largest planar surface 11. In the implementation shown the bottom surface of the sensor wafer is pointed out as the largest planar surface but the top surface could also be a largest planar surface, similar to that described for the ASIC wafer. The sensor wafer includes an array of pixels (pixel array) 12.

A number of layers 16 are deposited over the sensor wafer including a first layer 18 (which in the implementation shown is formed of a dry oxide), a second layer 20 (which in the implementation shown is a HfO2/Ta2O5 layer), third layer 22 (which in the implementation shown is an oxide layer) and fourth layer 24 (which in the implementation shown is a bottom anti reflection coating (BARC) layer). The assembly 2 is seen to have an active pixel area 26, a shield area 28, a three dimensional (3D) pad area 30, a test pad (e-pad) area 32, and a scribe line (SL) area (alignment marks area) 34 which may include scribe line marks (SPMs) and/or overlay (OVL) indicators.

A number of electrical couplers are included in the assembly including vertical vias 36 (which may be through-silicon vias (TSVs) or through-oxide vias (TOVs)) and horizontal lines 38 in both the 3D pad and e-pad areas. There are openings 40 in the assembly allowing a testing contact 42 to electrically couple with one or more of the horizontal lines and/or vertical vias. In the implementation shown the testing contact is an aluminum (Al) pad 44. An opening 60 in one or more layers of the assembly allows access to the testing contact so that various electrical/functional testing procedures may be performed during and/or after fabrication of the image sensor package.

A shield layer (layer) 48 is deposited over the layers 16 and in the implementation shown is formed of an oxide/TiN/W layer. A layer 50 is deposited over the shield layer and in the implementation shown is formed of an oxide. A layer 52 is deposited over layer 50 and in the implementation shown is formed of SiON. A layer 56 is deposited over the layer 52 and in the implementation shown is a passivation oxide 58.

Layers 48/50/52/56 have corresponding recesses 46. It may be seen in the drawing that the recesses were formed by forming an opening in the layers 16 prior to depositing layer 48 so that when layer 48 was deposited it formed a recess, and then the successive layers 50/52/56 also formed corresponding recesses when they were deposited. This configuration may be used, among other things, to electrically ground the shield layer and/or otherwise electrically couple it with the sensor wafer by contacting it with the sensor wafer.

Before the layer 56 was deposited a number of openings 54 were formed through the layers 52/50/48/24 and partway into the third layer 22. These openings (as with any others formed during the fabrication of the image sensor package) may be done by selective etching, including using any photolithographic techniques, laser drilling, or any other material removal process. Similarly, any of the layers and materials may be deposited using any material deposition techniques including, but not limited to, sputtering, electroplating, electroless plating, chemical vapor deposition (CVD), physical vapor deposition (PVD), and so forth.

After the openings 54 are formed the layer 56 is then deposited so that the passivation oxide 58 coats the inner walls and the bottom surface of the openings 54. The openings are then further filled with materials corresponding with various color filters. For example, one opening may be filled with a first material configured to allow a certain wavelength range to pass through to the pixel array below while blocking other wavelengths, and other opening may include other materials. Thus there may be red pixels, blue pixels, green pixels, etc., each allowing certain wavelength(s) of light (which may be human visible wavelengths, or human invisible wavelengths) to pass through while blocking others. In this way a color filter array (CFA) 62 is formed, with a number of color filters 64 being aligned with the pixels of the pixel array so that each color filter allows light of specified wavelengths to pass through to one pixel below while generally preventing other wavelengths from passing through the filter and generally blocking light from passing through to the sensor wafer except through the color filters.

FIG. 1 is a cross-section view but the viewer may envision that the CFA if viewed from above (and similarly the pixel array if viewed from above) would be seen to be a matrix/array aligned into rows and columns so that it has an overall rectangular perimeter surrounding it (though other matrix/array shapes are possible). A lens layer 66 is deposited over the layer 56 and also over the CFA. The lens layer is seen to form a number of lenses (microlenses) 70 so that there is one lens over each color filter. There are also lenses seen to the right of the figure at regularly spaced intervals that are not located over color filters. In implementations these are dummy lenses and may be included as an aid in processing steps to provide needed feature densities and/or provide proper structural integrity of the lens layer among other reasons. The lens layer in implementations is formed of an organic layer 68.

A larger lens is seen in the leftmost portion of FIG. 1, generally deposited over two other lenses. This larger lens is an autofocus lens and is used for an autofocusing feature of the image sensor package (which may utilize a phase detection technique by dividing incoming light into pairs of images and comparing them). This lens may not be included in various implementations. An antireflective coating (ARC) layer 72 is deposited over the lens layer (including any autofocus lens provide) and may be formed of an oxide 74.

A light block layer 76 is deposited over the semiconductor wafers and in the implementation shown is deposited over the ARC layer. The light block layer in implementations may be configured to block a specific wavelength range, such as ultraviolet (UV) light, visible light, infrared (IR) light, and the like, and any combination thereof. The light block layer may be formed of one or more materials that substantially blocks a desired wavelength while substantially allowing other wavelengths of light to pass therethrough. The light block layer forms/defines an opening 77 that allows access to the lenses. In implementations, when the opening is viewed from above, it would be seen to expose a perimeter of the lenses (and to circumscribe the lenses with a rectangle). Although the perimeter of the lenses is not shown in the drawings it should be easily envisioned by imagining the top view of the assembly of FIG. 1, i.e., as seen from above, with the perimeter being defined as a line which circumscribes the active lenses (therefore generally forming a rectangle in implementations) and being located between the active lenses and the dummy lenses. Defined in this way, the light block layer is coupled around the perimeter of the lenses.

An encapsulation layer 78 is deposited over the semiconductor wafers and over the light block layer so that it contacts the light block layer and in some cases the outermost lenses—only one lens is seen being contacted by the encapsulation layer in FIG. 1 but as this is a cross-section view it may be envisioned that if viewed from above a rectangular perimeter of outermost lenses would all be contacted by the encapsulation layer in the assembly of FIG. 1. In other implementations, no lenses may be contacted by the encapsulation layer. The encapsulation layer has a thickness (height) 80 perpendicular to the largest planar surfaces of the first and second semiconductor wafers. In the implementation illustrated the thickness is less than about 1.5 microns.

While the testing contact may be used for testing of the image sensor package it may also later be used as a permanent electrical connection between one or more elements of the package and one or more devices/power supplies etc. external to the package. A wirebond may be coupled with the testing contact and the testing contact may therefore function as a bond pad. A mold compound may be used to encapsulate the wirebond and may at least partially encapsulate the encapsulation layer, and a transparent cover may be placed over the lenses (forming an air cavity between the transparent cover and the lenses).

The transparent cover (which may be formed of a glass oxide) may be bonded with the mold compound to hold the transparent cover in place. The transparent cover itself may also have a lens (such as one large lens) which focuses incident light towards the microlenses 70. Examples of this are described in the '966 application, which also describes forming the array into a chip scale package (CSP) by forming one or more vias (such as TSVs), one or more redistribution layers (RDLs), one or more solder resist layers, and a number of solder bumps to form a ball grid array (BGA) CSP. Other configurations are possible, but any configuration described in the '966 application could be used for any of the packages described in the present application. While specific materials, layers, dimensions, etc., are described herein for assembly 2 (and for other assemblies), modifications and variations that are described in the '966 application may be applied to any of the representative assembly/package examples disclosed herein.

The image sensor may have an interline charge-coupled device (CCD) architecture and may have other features, such as features disclosed in Appendix A: "KAI-2020 1600 (H)×1200 (V) Interline CCD Image Sensor," published by Semiconductor Components Industries, LLC of Phoenix, Ariz., December 2015, the entire disclosure of which is incorporated entirely herein by reference.

FIG. 1 illustrates a conventional assembly 2. Assemblies/packages such as those disclosed herein have a keep out zone (KOZ) between the image sensor array and the die edge. The KOZ includes the space between the outermost active pixel (and accordingly the outermost active microlens) and the die edge. Stacked dies have smaller KOZs. For example, conventional designs for non-stacked image sensor packages having a ball grid array (BGA) or interstitial ball grid array (iBGA) design include KOZs of, or of about, 900 microns. Stacked image sensor dies disclosed herein in FIGS. 2-9 may have KOZs of, or of about, 300 microns. The image sensor dies and assemblies used in their formation, that are shown in FIGS. 2-9, have stacked configurations, and the methods/structures disclosed herein may enable stacked BGA/iBGA packages having a KOZ of about 300 microns or less. Methods/structures disclosed herein may in general enable molding of stacked image sensors having KOZs of about 300 microns or less regardless of whether they are configured as BGA/iBGA packages. Such image sensor packages may have many applications and may be used in many industries including by non-limiting example automotive, security, scanning, and mobile device industries.

The smaller KOZ could increase the likelihood that the mold compound contacts, or otherwise interferes with, the desired operation of one or more lenses. It is undesirable to have mold compound contacting any of the lenses or otherwise preventing light from entering the lenses, as this may negatively affect the image sensing properties of the package.

Figure 2:
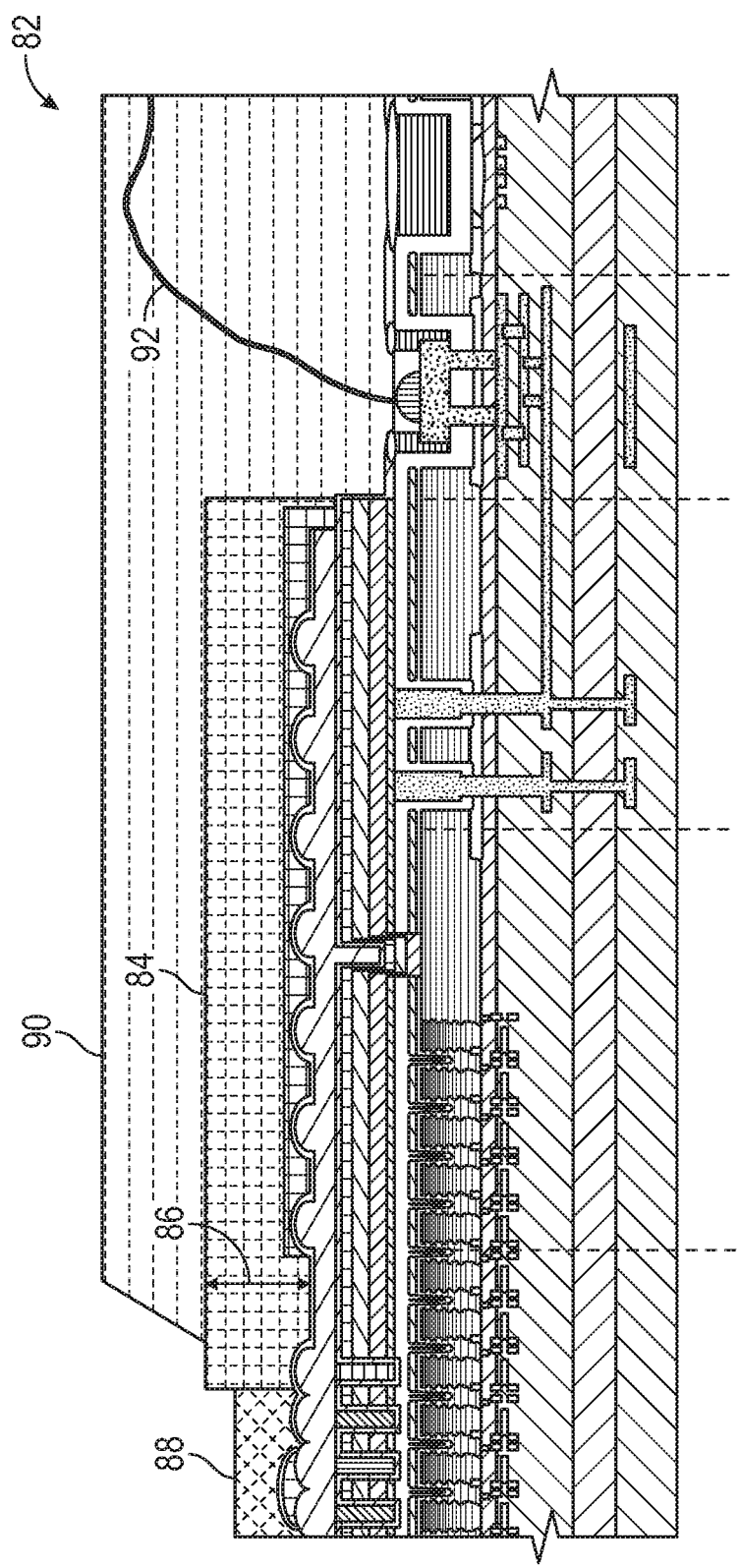
FIG. 2 is a side cross-section view of an implementation of an assembly formed during the formation of the image sensor package of FIG. 7.
Figure 7:
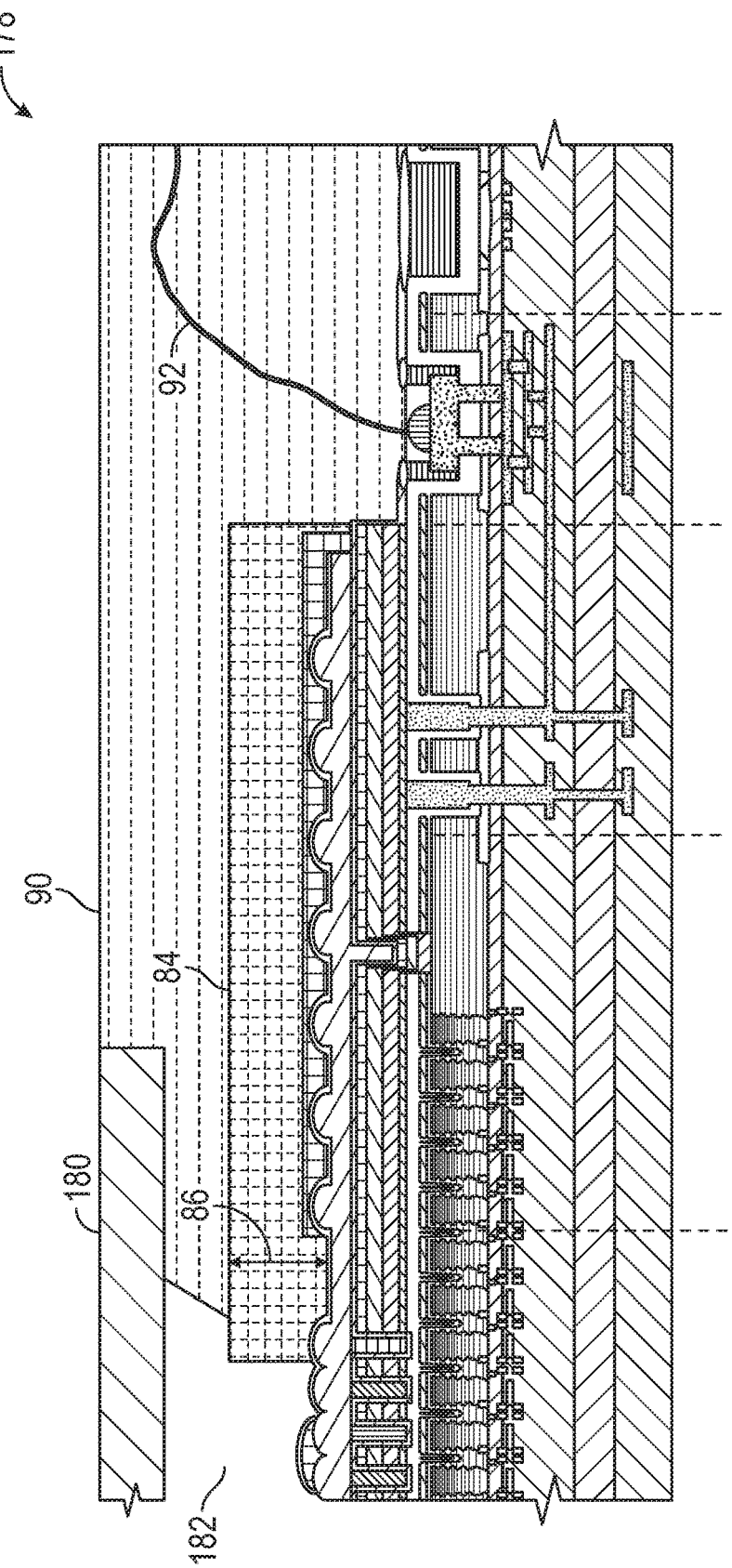
FIG. 7 is a side cross-section view of an implementation of an image sensor package.

FIG. 2 shows a representative example of an assembly 82 used in the formation of the image sensor package (ISP) (package) 178 of FIG. 7. The assembly is seen to be, in many respects, similar in structure to assembly 2. However, one notable difference is that the encapsulation layer 84, which is deposited over the light block layer, has a thickness 86 (perpendicular to the largest planar surfaces of the semiconductor wafers) of at least about 10 microns. In implementations this thickness could have other values. For instance, it could have a thickness between about 8 microns and about 12 microns, or a thickness of at least about 8 microns. In the representative example of FIG. 2 it has a thickness of at least about 10 microns.

In implementations the encapsulation layer may be formed of a photodefinable dielectric material such as, by non-limiting example, a material marketed under the trade name WPR-5200 by JSR Micro, Inc. of Sunnyvale, Calif., or a material marketed under the trade name SU-8 by MicroChem Corp. of Westborough, Mass. The encapsulation layer could be formed of other materials. In implementations it could be an acrylic polymer, a dry film photoresist layer, a hard-baked layer, and so forth (and in some cases it may be a combination of these). It need not be photodefinable but using a material that is photodefinable may allow for fewer overall processing steps. The encapsulation layer is coupled around the aforementioned perimeter of the lenses. This is the case, although the perimeter (which would be located between the active lenses and the dummy lenses) is to the right of the leftmost portion of the encapsulation layer in FIG. 2, because at least some of the encapsulation layer (or a portion of it) is coupled "around" the perimeter. In the example of FIG. 2 most of the encapsulation layer is to the right of the perimeter of the active lenses.

After the encapsulation layer is in place the mold compound layer 90 is applied. A wirebond 92 is seen in FIG. 2 and is in place before the mold compound is deposited or applied. Several techniques may be used to deposit the mold compound, and at least one will be described in more detail later. In the representative example shown in FIG. 2 the height 86 of the encapsulation layer, which has an increased height compared with the conventional assembly of FIG. 1, helps to ensure that the mold compound does not contact or otherwise interfere with the active lenses. This may, in various implementations, be in part to the fact that the mold compound would have to travel farther to reach the active lenses. In this way the height of the encapsulation layer is configured to prevent (and/or prevents) the mold compound layer from contacting the lenses during application of the mold compound layer.

In FIG. 2 it may be seen that the encapsulation layer is disposed or is situated, at least partially, between the mold compound layer and the lenses. The mold compound layer in this example contacts the encapsulation layer, though in other implementations there could be one or more layers between the two so that the mold compound layer and encapsulation layer do not contact one another. Having no layers between them may result in fewer processing steps/time.

FIG. 2 also shows a temporary protection layer (layer) 88. The use of a temporary protection layer may be an additional protection for the lenses to ensure that the mold compound does not contact, or otherwise interfere with, the lenses. In the implementation shown in FIG. 2, the temporary protection layer is applied or dispensed as a liquid after the encapsulation layer has been formed but before the mold compound has been applied/dispensed. The liquid is then cured or otherwise allowed to dry/solidify so that it forms a solid/semisolid layer over the active lenses. If any of the mold compound were to spill/bleed past the encapsulation layer and over the active lenses, it would then deposit on the temporary protection layer instead of on the lenses, and the removal mechanism which removes the temporary protection layer may also remove any such excess mold compound that has deposited thereon. In other implementations an additional material removal technique or step may be utilized to remove any mold compound that has deposited on the temporary protection layer before a later step of actually removing the temporary protection layer is performed.

A number of materials could be used for the temporary protection layer. In some cases, it could be formed of an organic material. In some cases, it could be formed of an acrylic material. In implementations it could be a novolac polymer (a phenol formaldehyde (PF) resin/synthetic polymer obtained by the reaction of phenol or substituted phenol with formaldehyde). In implementations it could be formed of a photoresist or other photodefinable material.

In one method of applying/depositing liquid over the active lenses an image sensor die (which may be unsingulated and include the elements described above including portions of the semiconductor wafers, pixel array, CFA, lenses, etc., and the light block layer) has a liquid (which may be a liquid resin or any of the other materials described above) deposited thereon using a jetting nozzle. The liquid is then cured, or baked, or irradiated using UV light or the like, or in some other way formed into a solid/semisolid layer.

In such an implementation the encapsulation layer is first deposited and then the temporary protection layer is deposited so that dispensing the liquid contacts the encapsulation layer with the liquid. In the example of FIG. 2 the top surface of the temporary protection layer is below a top surface of the encapsulation layer.

It is noted here that the drawings show overly simplified and focused-in portions of image sensor packages. The layers and various elements are not drawn to scale, and only a portion of the image sensor package is shown, for ease in viewing the elements. For example, the cross-section shown in FIG. 2 reveals a portion of only a single pixel array, a single CFA array, etc. Although only individual arrays are shown, the image sensors may be formed in such a way that there are many image sensors formed on the same wafers. Accordingly, although there may be only one sensor wafer and one ASIC wafer, there would generally be a plurality of image sensors formed thereon. If the wafers were viewed from above the image sensors could be seen aligned in rows and columns, with each image sensor including a single pixel array, a single color filter array (CFA) formed over the pixel array, a single active lens array formed over the CFA, etc. The mold compound could be applied before or after singulation, the transparent cover could be attached before or after singulation, and so forth. The wafers could include any semiconductive substrate material including silicon, gallium arsenide (GaAs), and so forth. In the representative examples they are formed of silicon.

After the mold compound layer 90 is applied, and before a transparent cover is coupled over the active lenses, the temporary protection layer is removed. A number of methods/materials may be used to remove the temporary protection layer, including using one or more solvents. In some cases, hot water may be enough to remove the temporary protection layer. Ethanol may be used in some cases.

Organic solvents or inorganic solvents may be used. Acetone is one example of a solvent that could be used, and propylene glycol methyl ether acetate (PGMEA) is another example. When solvents are used the temporary protection layer may be dissolved in the solvent to remove it, such as by placing the assembly in a solvent bath for a predetermined amount of time and then removing it and/or performing a washing procedure. In some implementations the temporary protection layer could be removed using dry etching or ashing. Other solvents and/or other material removal techniques could be used in other implementations.

Due to the ability of the temporary protection layer to prevent mold compound from contacting the lenses and/or the ability to remove any mold compound that has seeped over the temporary protection layer before or during removal of the temporary protection layer, the temporary protection layer is configured to prevent (and/or prevents) the mold compound layer from contacting the lenses.

FIG. 7 shows an image sensor package (ISP) 178 that is formed after the removal of the temporary protection layer. A transparent cover 180 is coupled over the active lenses, forming a cavity 182 between the transparent cover and the active lenses. The transparent cover in this case is applied after singulation of the wafer assembly. Final package processing and formation may include any methods/structures described in the '966 application, as indicated above, and the transparent cover may be formed of a glass oxide or some other transparent material.

Figure 4:
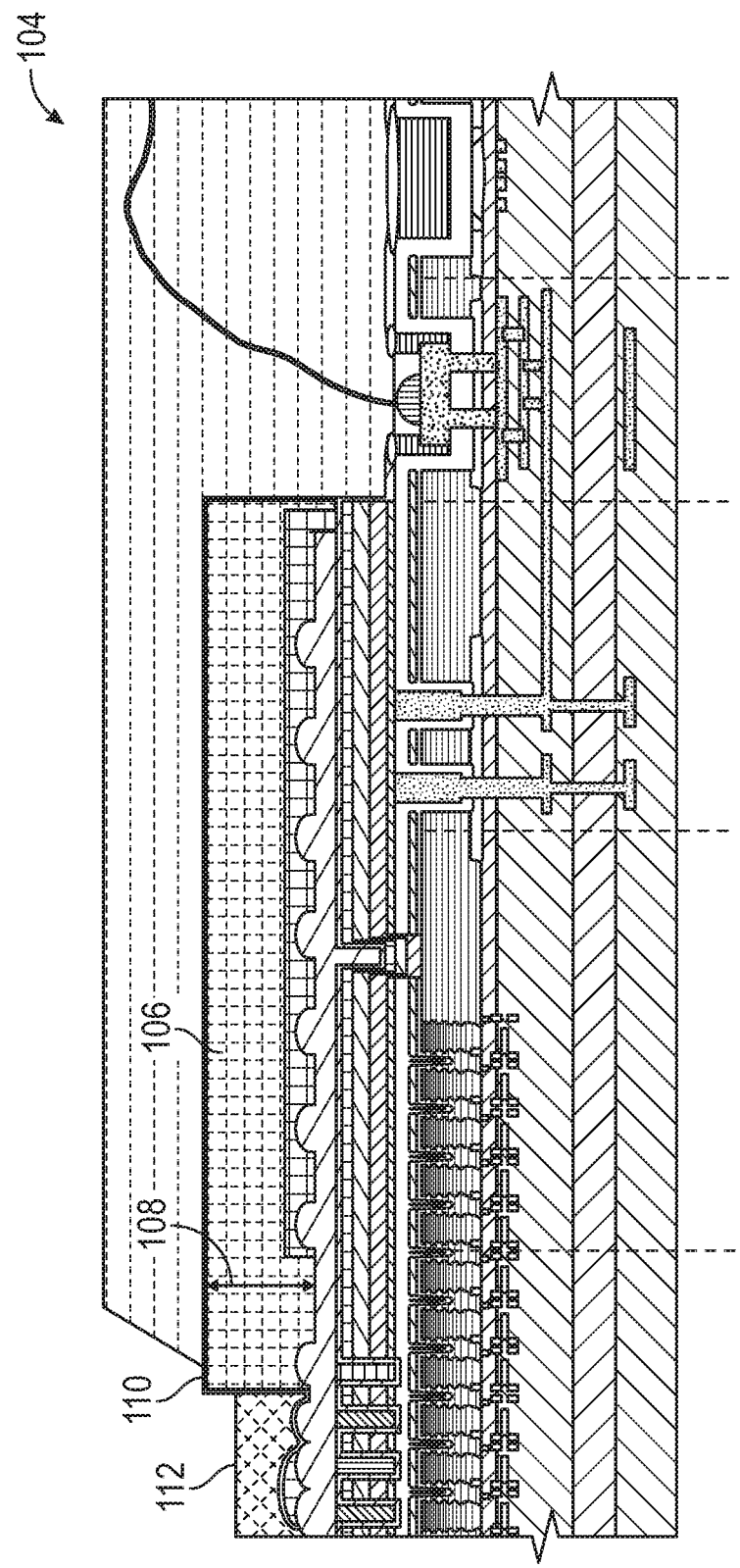
FIG. 4 is a side cross-section view of an implementation of an assembly formed during the formation of an image sensor package.

Reference is now made to FIG. 4, which representatively illustrates an assembly 104 that is in many ways similar to that shown in FIG. 2, with the encapsulation layer 106 having a thickness (height) 108 perpendicular to the largest planar surfaces of the semiconductor wafers similar to that described above for the FIG. 2 assembly, with the main difference being that the antireflective coating (ARC) layer 110 is deposited after the encapsulation layer was deposited. Because of this the ARC layer is coupled over the lenses and over the encapsulation layer.

In such an implementation the liquid that is deposited/applied to form the temporary protection layer 112 contacts the ARC layer when deposited and the mold compound contacts the ARC layer when it is deposited instead of contacting the encapsulation layer directly. In some cases, a portion of the encapsulation could remain uncovered by the ARC layer so that when the mold compound layer is deposited it contacts both the ARC layer and the encapsulation layer (similarly in some cases a portion of the light block layer could be uncovered by the encapsulation layer so that when the mold compound layer is deposited it contacts the ARC layer, the encapsulation layer, and the light block layer).

In the implementation shown in FIG. 4, because the encapsulation layer has the larger height/thickness as described above with respect to FIG. 2, the height of the encapsulation layer is configured to prevent (and/or prevents) the temporary protection layer from spilling over onto the encapsulation layer and creating poor adhesion with the mold compound, as well as preventing the mold compound from contacting the lenses and otherwise interfering with their desired operation. It may also be said that with the implementation of FIG. 4 the combined heights of the encapsulation layer and ARC layer perpendicular to the largest planar surfaces of the semiconductor wafers prevents (and/or is configured to prevent) the mold compound from contacting the lenses or otherwise interfering with their desired operation. In the representative example of FIG. 4 the placement of the ARC layer over the encapsulation layer may reduce reflections that could otherwise be present, which otherwise could cause noise in the image signal(s). The temporary protection layer (for this assembly and for others described herein) is configured to have the same preventative function as was described above for the temporary protection layer of FIG. 2.

Figure 5:
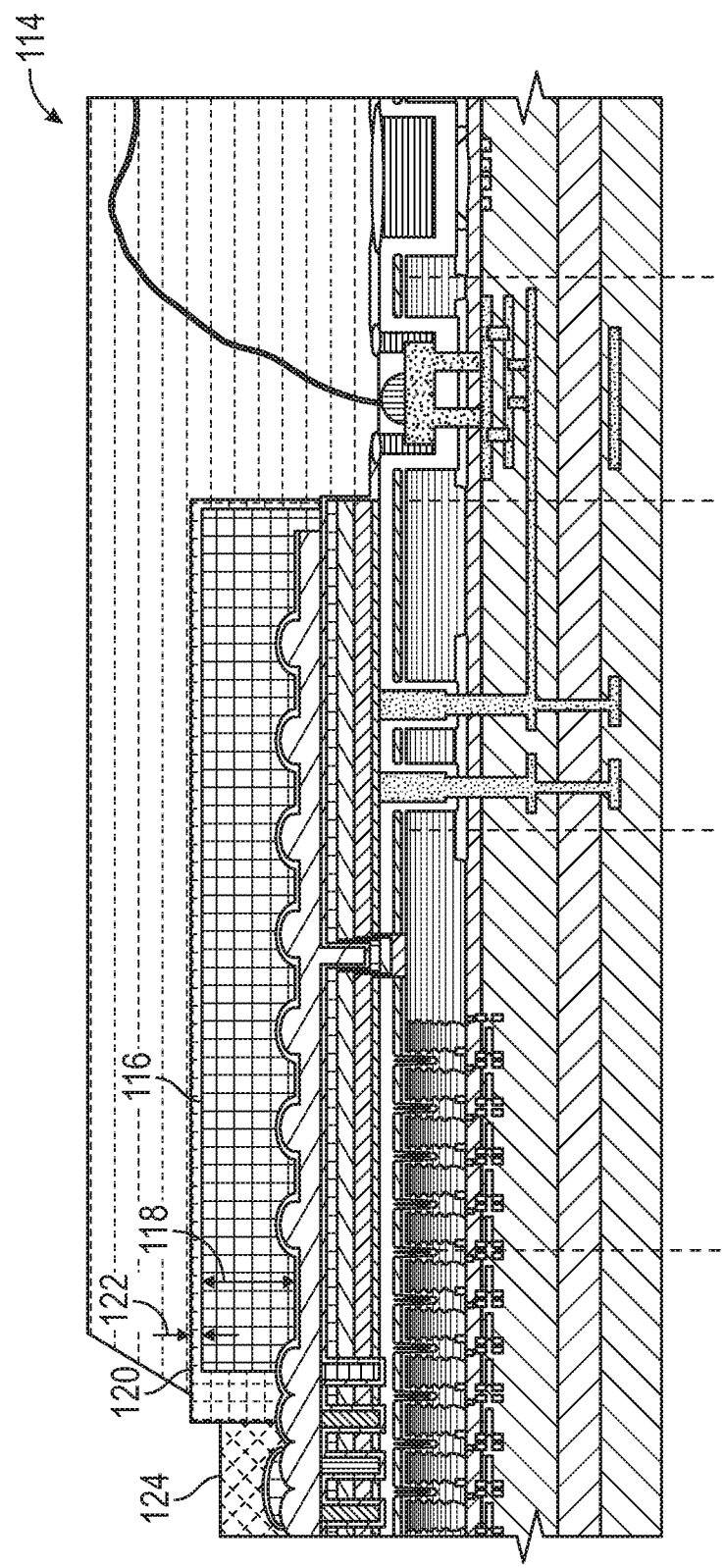
FIG. 5 is a side cross-section view of an implementation of an assembly formed during the formation of an image sensor package.

Reference is now made to FIG. 5, which representatively illustrates an assembly 114 that is in many ways similar to that shown in FIG. 2, with the combined thicknesses (heights) 118 and 122 of the light block layer 116 and encapsulation layer 120, respectively, summing to a total thickness/height of at least 10 microns. In other implementations the total thickness could be between 8 microns and 12 microns. In the implementation shown the increased thickness of the light block layer is, or is about, 4 microns thick. In other implementations the light block layer could be at least about 3 microns thick. A light block layer having one of these thicknesses could be formed and patterned using lithography and/or etching mechanisms. In FIG. 5 the encapsulation layer thickness above the light block layer appears to be smaller than the thickness of the light block layer but the reader is reminded that the layers are not drawn to scale and that the thickness 122 may be greater than thickness 118 in order to achieve the overall combined desired height. The temporary protection layer 124 is deposited/applied so that it contacts the ARC layer and the encapsulation layer before the mold compound layer is applied. The temporary protection is later removed, as described above for other assemblies, and then a transparent cover is attached to the assembly forming an air cavity between the transparent cover and the lenses.

In the implementation shown in FIG. 5, it may also be said that the combined heights of the encapsulation layer and the light block layer perpendicular to the largest planar surfaces of the semiconductor wafers prevents (and/or is configured to prevent) the temporary protection layer from spilling over onto the encapsulation layer and creating poor adhesion with the mold compound, as well as preventing the mold compound from contacting the lenses or otherwise interfering with their desired operation. It may also be broadly stated that the height of the encapsulation layer prevents (and/or is configured to prevent) the mold compound from contacting the lenses or otherwise interfering with their desired operation—this is true because the top surface of the encapsulation layer is raised to an overall greater height relative to the lens layer due to the increased thickness of the light block layer—and thus the "height" referred to is the location of the top surface of the encapsulation layer relative to the top surface of the lens layer (instead of the top surface of the encapsulation layer relative to the top surface of the light block layer). The temporary protection layer is configured to have the same preventative function as was described above for the temporary protection layer of FIG. 2.

Figure 3:
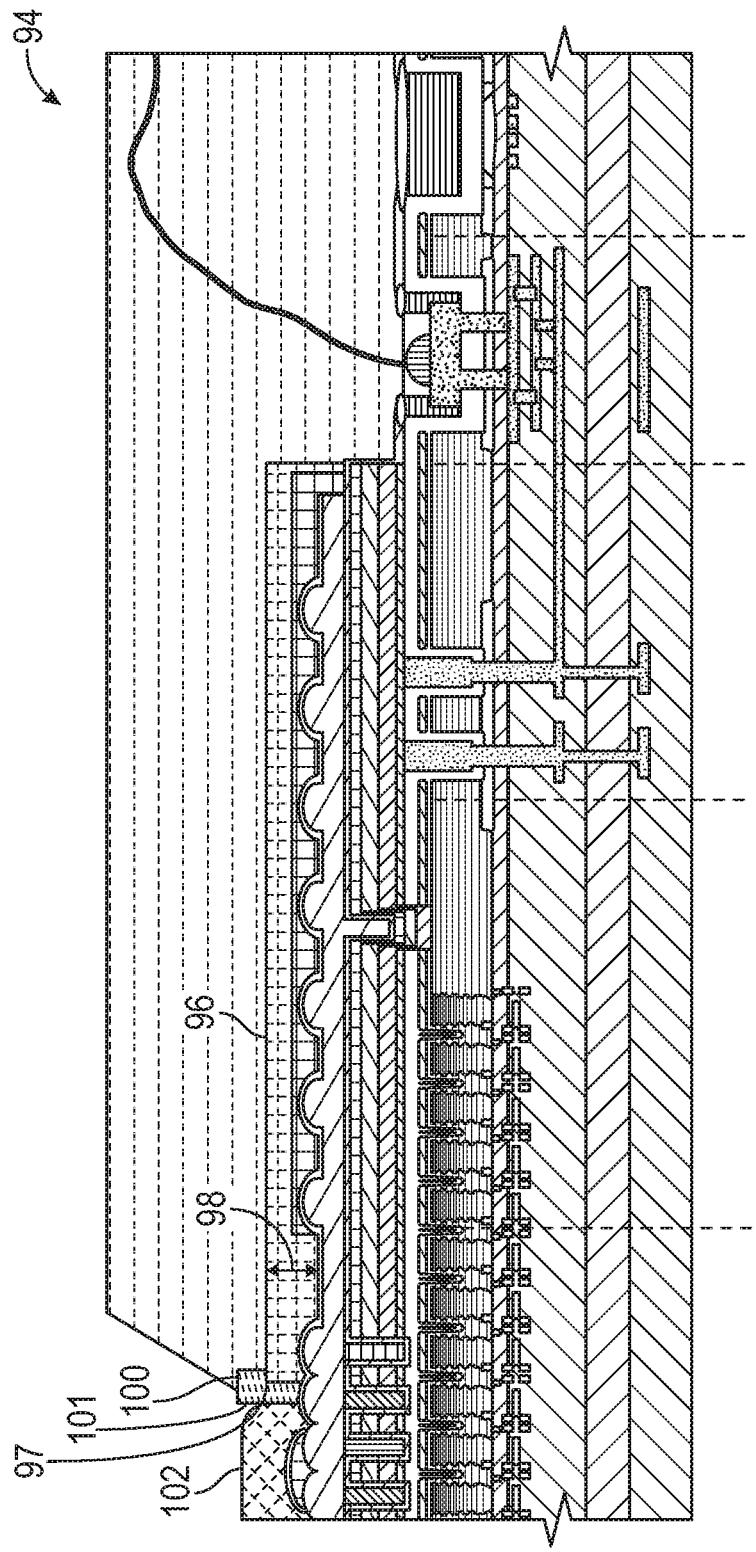
FIG. 3 is a side cross-section view of an implementation of an assembly formed during the formation of an image sensor package.

Reference is now made to FIG. 3, which illustrates a representative assembly 94 in which the thickness (height) 98 of the encapsulation layer 96 has not been changed relative to the height 80 of FIG. 1 of the conventional ISP, but an additional dam structure 100 has been added. The dam structure shown in FIG. 3 is formed at an edge 97 of the encapsulation layer and includes a face 101 that faces inward towards the active lenses. In the representative example some of the lenses are rendered inactive by placement of the dam structure and/or encapsulation layer over them, though in some cases one or more of the dam structure and a portion of the encapsulation layer could be removed before placement of the transparent cover to render them active again. The dam structure is thus represented in FIG.

3 as a different layer or structure than the encapsulation layer itself. In implementations, however, the dam structure and encapsulation layer could be formed of the same material and layer. For example, a larger encapsulation layer could be deposited and then a portion of it could be removed so that a portion nearer the active lenses is taller—thus forming a dam structure—while the remainder of the encapsulation layer is shorter. This could have the benefit of fewer processing steps (depending on the process flow) and/or a decreased thickness of the overall package.

In the example shown in FIG. 3 the dam structure is a separate structure that, although contacting the encapsulation layer, is formed separately and/or of a different material. In some cases, the dam structure could be formed at an earlier processing step, such as while the CFA structure is being formed. In the implementation shown in FIG. 3 the dam structure is formed after the lens layer, ARC layer, and encapsulation layer are formed and before the temporary protection layer 102 is deposited or applied (and accordingly before the mold compound layer is applied).

The dam structure may have a total thickness (greatest thickness) (height) perpendicular to the largest planar surfaces of the semiconductor wafers of between (and including) about 2-15 microns. An about 2-micron thick dam structure would still be taller than the conventional height of the encapsulation layer of FIG. 1. In some implementations the dam structure will have a height of between (and including) about 5-10 microns. In some implementations the dam structure will have a height of at least about 10 microns. In implementations, as with those shown in the drawings, the dam structure will have a height such that a top surface of the dam structure is higher than a top surface of the light block layer and a top surface of the encapsulation layer. In some cases, as described above, the encapsulation layer could be excluded, and in that case the dam structure would have a height such that the top surface of the dam structure is higher than the top surface of the light block layer.

The dam structure is configured to prevent the temporary protection layer from spilling over onto the encapsulation layer and creating poor adhesion with the mold compound, as well as preventing the mold compound from contacting the lenses or otherwise interfering with their operation. In implementations one of the ways the dam structure may be able to do this, although having an overall height less than the taller about 10 microns (or about 8-12 microns) encapsulation layers described above, is due to the ability to tailor the phobicity of the dam structure (and in some cases the phobicity of particular portions or faces of the dam structure), as will be described hereafter. Another mechanism may be increased surface tension of the mold compound proximate the dam structure due to the face and/or edge of the dam structure that abuts the mold compound while the mold compound is solidifying—which may prevent the mold compound from seeping onto the lenses or otherwise crossing the face 101 of the dam structure. In any case, the dam structure may be shorter, overall, than the encapsulation layer described in FIG. 2 and/or in other examples described herein and yet may still provide the desired preventative function.

A number of materials may be used to form the dam structure. As described above, the dam structure could be integral to the encapsulation layer and/or the CFA, and in some cases the dam structure could instead be integral to the light block layer, and so in such cases the dam structure could be formed of any of the materials used to form those structures. The dam structure could be formed of a photo-definable patternable polymer. An acrylic is an example of a material that could be used in various implementations.

The phobicity of the dam structure relative to the temporary protection layer 102 and/or the mold compound layer may be tailored as desired. For example, it may be desirable to have the dam structure be phobic to the temporary protection layer but not phobic to the mold compound layer. This is the configuration shown in FIG. 3—the non-phobicity of the dam structure relative to the mold compound allows the mold compound to adhere well to the dam structure, thus forming a strong bond therewith, while the phobicity of the dam structure (which, it is pointed out again, may be shorter than the encapsulation layers of previous examples) relative to the temporary protection layer may prevent the temporary protection layer from seeping out onto the encapsulation layer and/or the light block layer. Such a seeping or leaking/spilling over of the temporary protection layer could prevent the mold compound layer from forming a strong bond with the encapsulation layer and/or the light block layer, and so is undesirable.

In some implementations, however, the dam structure could be formed or treated so that it is phobic both to the temporary protection layer and the mold compound. In such implementations the phobicity of the dam structure relative to the mold compound may prevent the mold compound from seeping past the dam structure and onto the lenses or otherwise interfering with the desired operation of the lenses. In the cases shown in the drawings the dam structure is phobic to the temporary protection layer but not to the mold compound.

The temporary protection layer and the mold compound layer may both be formed of organic materials, so that merely coating the dam structure with an organophobic material (or forming it entirely thereof or treating all of the dam structure to make all of its surfaces organophobic) may not result in selective phobicity only towards the temporary protection layer. A hydrophobic material or treatment may not have the desired functions because the temporary protection layer and the mold compound may not be water based. Accordingly, in some implementations methods may be utilized to alter the phobicity of only a portion of the dam structure. A post developed treatment, such as fluorinating the dam structure only at the face 101 (or only at the face 101 and the top of the dam structure), may result in phobicity towards the temporary protection layer while retaining a native (inherent) non-phobicity towards the mold compound layer. Vapor priming, plasma treatment, or a combination of both may also or alternatively be used to modify the phobicity of the dam structure. Selective treatment of some surface(s) of the dam structure without treating other surface(s) of the dam structure could be accomplished by, among other methods, covering a portion of the dam with a material before the treatment and then later removing the material.

The temporary protection layer 102 is deposited/applied so that the liquid contacts the dam structure. In the implementation of FIG. 3, when the mold compound layer is applied the mold compound is positioned over the encapsulation and light block layers and contacts the encapsulation layer and the dam structure. After the mold compound solidifies the temporary protection layer is removed, a transparent cover is attached over the assembly, and the assembly is singulated. In some cases, removal of the temporary protection layer also removes the phobicity of the dam structure (either only where the temporary protection layer contacted the dam structure, or from every portion of the dam structure that had the phobicity and that was exposed or became exposed during the removal of the temporary protection layer).

Figure 6:
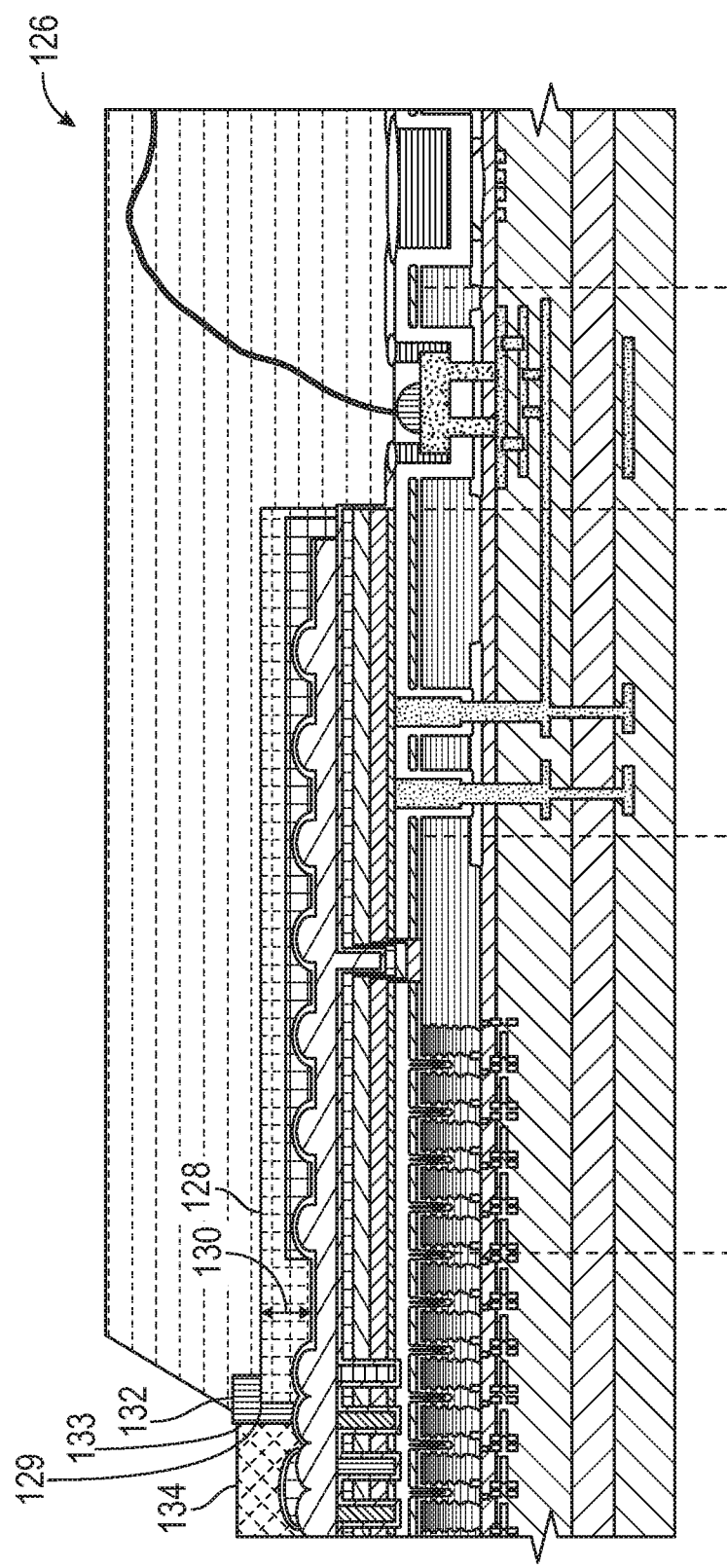
FIG. 6 is a side cross-section view of an implementation of an assembly formed during the formation of an image sensor package.

FIG. 6 shows an assembly 126 that is similar in many regards to the assembly of FIG. 3 except that the dam structure 132 is not phobic to the temporary protection layer 134. It is also not phobic to the mold compound layer. The dam structure is formed at an edge 129 of the encapsulation layer 128 and has a face 133 that faces inward towards the active lenses. As before, in the representative example some of the lenses are rendered inactive by placement of the dam structure and/or encapsulation layer over them, though in some cases one or more of the dam structure and a portion of the encapsulation layer could be removed before placement of the transparent cover to render them active again. The thickness (height) 130 of the encapsulation layer perpendicular to the largest planar surfaces of the semiconductor wafers may be the same as the thickness of the encapsulation layer of the conventional assembly of FIG. 1, and the mechanism(s) described above, and/or other mechanisms, may prevent the mold compound from seeping onto the lenses and/or the temporary protection layer from seeping onto the encapsulation layer/light block layer, notwithstanding the relatively shorter overall thickness (height) of the dam structure 132 perpendicular to the largest planar surfaces of the semiconductor wafers (which thickness may be any of the thicknesses described above for the phobic dam structure 100) relative to the previously described thicker encapsulation layers for other assemblies, and notwithstanding the lack of phobicity.

Accordingly, the heights of the dam structures of FIGS. 3 and 6 may be configured to prevent (and may prevent) the temporary protection layer from spilling over onto the encapsulation layer and creating poor adhesion with the mold compound, and also preventing the mold compound layer from contacting the lenses during application of the mold compound layer and may be configured to prevent (and may prevent) the mold compound layer from crossing the face 101/133 of the dam structure. The phobicity of the face 101/133 may also and/or alternatively prevent the temporary protection layer from crossing the face 101/133 and spilling over onto the encapsulation layer. The heights of the dam structures may also be greater than the heights of the encapsulation layers perpendicular to the largest planar surfaces of the semiconductor wafers.

In some cases, a higher/thicker encapsulation layer, such as in FIGS. 2, 4-5, and a dam structure such as in FIGS. 3 and 6 could be both used. In some implementations the temporary protection layer may be applied after wire bonding though in other cases it could be applied before wire bonding.

In some cases, one or more of the light protection layers, encapsulation layers, dam structures, and/or phobic dam structures could be formed of a film layer, such as a dry film resist material or a photodefinable dry film resist material or a lamination layer. In such cases one or more of these elements could be combined in a single layer (in other words integrally formed). Any of these, in implementations, could be formed using a film material marketed under the trade name SHIN-ETSU by Shin-Etsu Film Co., Ltd. of Tokyo, Japan.

A process flow of a method of applying the mold compound layer using film assisted molding (FAM) could include the following steps. A mold chase (chase) could include a top portion and a bottom portion and film rollers could be adjacent to the top portion. An image sensor die and substrate (which are already wirebonded) are placed on the bottom portion with the chase open. The temporary protection layer is already in place over the lenses. The film is rolled from one roller to the other and is vacuum conformed to the top portion. The chase is closed and the mold compound layer is injected. The mold is then opened and the unit is ejected/removed. The temporary protection layer is later removed and the transparent cover is attached. This process may be applied to a single die or may be used to mold multiple die at the same time.

In some cases a process flow of forming any of the packages described herein may include the following steps: backgrinding, dicing the wafer(s) to form a plurality of die, attaching the die to a substrate; wirebonding; dispensing of the temporary protection layer; film assisted molding (FAM); cure; removal of the temporary protection layer (including cleaning steps); glass attach; laser marking, package sawing; final visual inspection (FVI); electrical and/or optical testing, and; final packaging. In some cases, these steps could be performed in the order in which they are listed. In other implementations they could be performed in other orders and/or some steps could be excluded and/or other steps could be added. In some implementations the temporary protection layer could be added at the wafer level before backgrinding.

The temporary protection layers described herein may, in implementations, prevent contamination of the lenses (dust, contaminants, particles, contact of a mold head or a portion of a mold chase with the lenses) while the mold compound layer is being added and/or during steps that are performed outside of a cleanroom environment. In some implementations this may be the main function of the temporary protection layer (as opposed to, for instance, preventing the mold compound layer from depositing over the lenses—as mold compound spilling onto the lenses may be prevented in some instances by the mold chase configuration making a good seal during mold compound application).

Any of the oxide layers described herein that are not otherwise described as including any specific materials may, in implementations, be formed of a silicon oxide material, such as $SiO_2$ by non-limiting example.

Although the methods and structures disclosed herein are described using the representative example of formation of an image sensor package, the methods and structures may be used with other devices/assemblies to protect one or more surfaces during fabrication.

In places where the description above refers to particular implementations of image sensor packages formed using temporary protection layers and related methods and implementing components, sub-components, methods and sub-methods, it should be readily apparent that a number of modifications may be made without departing from the spirit thereof and that these implementations, implementing components, sub-components, methods and sub-methods may be applied to other image sensor packages formed using temporary protection layers and related methods.

What is claimed is:
1. An image sensor package, comprising:
a semiconductor wafer comprising a pixel array;
a color filter array (CFA) formed over the pixel array;
one or more lenses formed over the CFA;
a light block layer coupled over the semiconductor wafer around a perimeter of the one or more lenses;
an encapsulation layer coupled around the perimeter of the one or more lenses and over the light block layer, the light block layer forming an opening providing access to the one or more lenses, and;

a mold compound layer coupled over the encapsulation layer and over the light block layer;

wherein a height of the encapsulation layer perpendicular to a largest planar surface of the semiconductor wafer is configured to prevent a temporary protection layer, applied over the one or more lenses before applying the mold compound layer, from depositing over the encapsulation layer.

2. The package of claim 1, wherein the encapsulation layer is comprised between the mold compound layer and the one or more lenses.

3. The package of claim 1, further comprising a transparent cover coupled over the one or more lenses and at least partially defining a cavity between the transparent cover and the one or more lenses.

4. The package of claim 1, wherein the height of the encapsulation layer perpendicular to the largest planar surface of the semiconductor wafer is at least 10 microns.

5. The package of claim 1, wherein the mold compound layer contacts the encapsulation layer.

6. The package of claim 1, further comprising an antireflective coating (ARC) layer coupled over the one or more lenses.

7. The package of claim 6, wherein the mold compound layer contacts the ARC layer.

8. The package of claim 1, wherein the light block layer comprises a height perpendicular to the largest planar surface of the semiconductor wafer of at least 3 microns.

9. An image sensor package, comprising:
a semiconductor wafer comprising a pixel array;
a color filter array (CFA) formed over the pixel array;
one or more lenses formed over the CFA;
a light block layer coupled over the semiconductor wafer around a perimeter of the one or more lenses;
an encapsulation layer coupled around the perimeter of the one or more lenses and over the light block layer;
a dam structure coupled at an edge of the encapsulation layer, and;
a mold compound layer coupled over the encapsulation layer, coupled over the light block layer, and coupled against the dam structure;
wherein a height of the dam structure perpendicular to a largest planar surface of the semiconductor wafer is configured to prevent a temporary protection layer, applied over the one or more lenses before applying the mold compound layer, from depositing over the encapsulation layer.

10. The package of claim 9, wherein phobicity of the dam structure relative to the temporary protection layer prevents the temporary protection layer from crossing a face of the dam structure that faces the one or more lenses.

11. The package of claim 9, wherein the height of the dam structure perpendicular to the largest planar surface of the semiconductor wafer is greater than a height of the encapsulation layer perpendicular to the largest planar surface of the semiconductor wafer.

12. The package of claim 9, wherein the mold compound layer contacts the encapsulation layer.

13. An image sensor package, comprising:
a semiconductor wafer comprising one or more lenses;
an encapsulation layer coupled around a perimeter of the one or more lenses, and;
a mold compound layer coupled over the encapsulation layer;
wherein a height of the encapsulation layer perpendicular to a largest planar surface of the semiconductor wafer is configured to prevent a temporary protection layer, applied over the one or more lenses before applying the mold compound layer, from depositing over the encapsulation layer.

14. The package of claim 13, wherein the encapsulation layer is comprised between the mold compound layer and the one or more lenses.

15. The package of claim 13, further comprising a transparent cover coupled over the one or more lenses and at least partially defining a cavity between the transparent cover and the one or more lenses.

16. The package of claim 13, wherein the height of the encapsulation layer perpendicular to the largest planar surface of the semiconductor wafer is at least 10 microns.

17. The package of claim 13, wherein the mold compound layer contacts the encapsulation layer.

18. The package of claim 13, further comprising an antireflective coating (ARC) layer coupled over the one or more lenses.

19. The package of claim 18, wherein the mold compound layer contacts the ARC layer.

* * * * *